(12) United States Patent
Nakamori (10) Patent No.: US 10,700,594 B2
(45) Date of Patent: Jun. 30, 2020

(54) POWER CONVERSION DEVICE (71) Applicant: FUJI ELECTRIC CO., LTD., Kawasaki (JP)

(72) Inventor: Akira Nakamori, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/174,986

(22) Filed: Oct. 30, 2018

(65) Prior Publication Data
US 2019/0190369 A1   Jun. 20, 2019

(30) Foreign Application Priority Data

Dec. 18, 2017 (JP) ................................ 2017-242156

(51) Int. Cl.
| H02M 1/32 | (2007.01) |
| H03K 17/14 | (2006.01) |
| H03K 17/567 | (2006.01) |
| H01L 29/739 | (2006.01) |
| H02M 3/156 | (2006.01) |
| H03K 17/08 | (2006.01) |
| H03K 17/082 | (2006.01) |
| H02M 1/08 | (2006.01) |

(52) U.S. Cl.
CPC .......... *H02M 1/32* (2013.01); *H01L 29/7393* (2013.01); *H02M 1/08* (2013.01); *H02M 3/156* (2013.01); *H03K 17/08* (2013.01); *H03K 17/0826* (2013.01); *H03K 17/14* (2013.01); *H03K 17/567* (2013.01); *H02M 2001/327* (2013.01); *H03K 2017/0806* (2013.01)

(58) Field of Classification Search
CPC ........ H02M 1/32; H02M 1/084; H02M 7/537; H03K 17/0828; H03K 17/18; G08B 21/00
See application file for complete search history.

(56) References Cited

U.S. PATENT DOCUMENTS

2013/0285732 A1   10/2013 Mori
2017/0077919 A1*  3/2017 Nakamori ............... H02M 1/00

FOREIGN PATENT DOCUMENTS

JP   2013-219633 A   10/2013

\* cited by examiner

*Primary Examiner* — Adolf D Berhane
*Assistant Examiner* — Afework S Demisse (57) ABSTRACT

A power conversion device includes a power semiconductor switching device and a drive circuit. The power semiconductor switching device is configured to supply constant power to a load by switching and to be turned on and off by a control signal from an external control circuit. The drive circuit is configured to detect an operating temperature of the power semiconductor switching device and drive the power semiconductor switching device according to a result of the detection. The drive circuit includes a temperature detecting unit configured to receive the control signal from the external control circuit and detect the operating temperature of the power semiconductor switching device at timings according to the control signal.

8 Claims, 6 Drawing Sheets

POWER CONVERSION DEVICE

CROSS-REFERENCE TO RELATED APPLICATIONS

The present application claims priority from Japanese Patent Application No. 2017-242156, filed Dec. 18, 2017, the entire content of which is incorporated herein by reference.

TECHNICAL FIELD

The present invention relates to a power conversion device having a power semiconductor switching device, particularly, to a power conversion device that adjusts the drive capability of a power semiconductor switching device according to the operating temperature of the power semiconductor switching device.

BACKGROUND ART

An Intelligent Power Module (IPM) configured by forming a power semiconductor switching device such as an IGBT and a diode for temperature detection in the same chip is known. This main IPM detects the voltage between both ends of the diode, and detects the operating temperature of the IGBT in the same chip based on the magnitude of the voltage between both ends of the diode. Further, the IPM changes the amount of current to drive the IGBT, according to the detected temperature, thereby adjusting the drive capability of the IGBT (see JP-A-2013-219633)

In the technology disclosed in JP-A-2013-219633, based on the magnitude of the voltage between both ends of a diode, the operating temperature of an IGBT is always detected. Therefore, the drive capability is continuously adjusted.

However, this method has a problem that switching noise of the IGBT, for example, noise which is generated when the IGBT is turned on is likely to be superimposed on the voltage between both ends of the diode. Therefore, in adjusting the drive capability according to the temperature of the IGBT, malfunction may occur due to the influence of noise.

SUMMARY

The present invention has been made in view of the above-mentioned circumstances, and an object of the present invention is to provide a power conversion device capable of reducing the influence of switching noise of a power semiconductor switching device and adjusting the drive capability according to the operating temperature of the power semiconductor switching device.

According to an aspect of the present invention, there is provided a power conversion device including: a power semiconductor switching device configured to supply constant power to a load by switching and to be turned on and off by a control signal from an external control circuit; and a drive circuit configured to detect an operating temperature of the power semiconductor switching device and drive the power semiconductor switching device according to a result of the detection, wherein the drive circuit includes a temperature detecting unit configured to receive the control signal from the external control circuit and detect the operating temperature of the power semiconductor switching device at timings according to the control signal.

According to another aspect of the present invention, a power conversion device including: a power semiconductor switching device configured to supply constant power to a load by switching and to be turned on and off by a first control signal from an external control circuit; and a drive circuit configured to detect an operating temperature of the power semiconductor switching device and drive the power semiconductor switching device according to a result of the detection, wherein the drive circuit includes a temperature detecting unit configured to receive a second control signal generated based on the first control signal output from the external control circuit and different from the first control signal, and detect the operating temperature of the power semiconductor switching device at timings according to the second control signal.

According to the above-described configuration, detection of the operating temperature of the power semiconductor switching device is not always performed, and is performed at timings according to the control signal received from the external control circuit. Since the operating temperature is detected at predetermined timings, for example, timings to turn off the power semiconductor switching device, as compared to the case of always detecting the operating temperature, the influence of switching noise of the power semiconductor switching device decreases. Therefore, it becomes possible to reduce the influence of switching noise of the power semiconductor switching device and change the amount of current to drive the power semiconductor switching device.

According to the above-described configuration, it becomes possible to reduce the influence of switching noise of the power semiconductor switching device and adjust the drive capability according the operating temperature of the power semiconductor switching device.

DETAILED DESCRIPTION OF EMBODIMENTS

Hereinafter, power conversion devices according to embodiments of the present invention will be described in detail with reference to the drawings. A feature of the present invention is to use circuit configurations in which in adjusting the drive capability of a power semiconductor switching device according to the operating temperature thereof, it is possible to reduce the influence of switching noise of the power semiconductor switching device, for example, noise which is generated when the power conversion device is turned on. Hereinafter, the individual embodiments will be described.

First Embodiment (Configuration)

Figure 1:
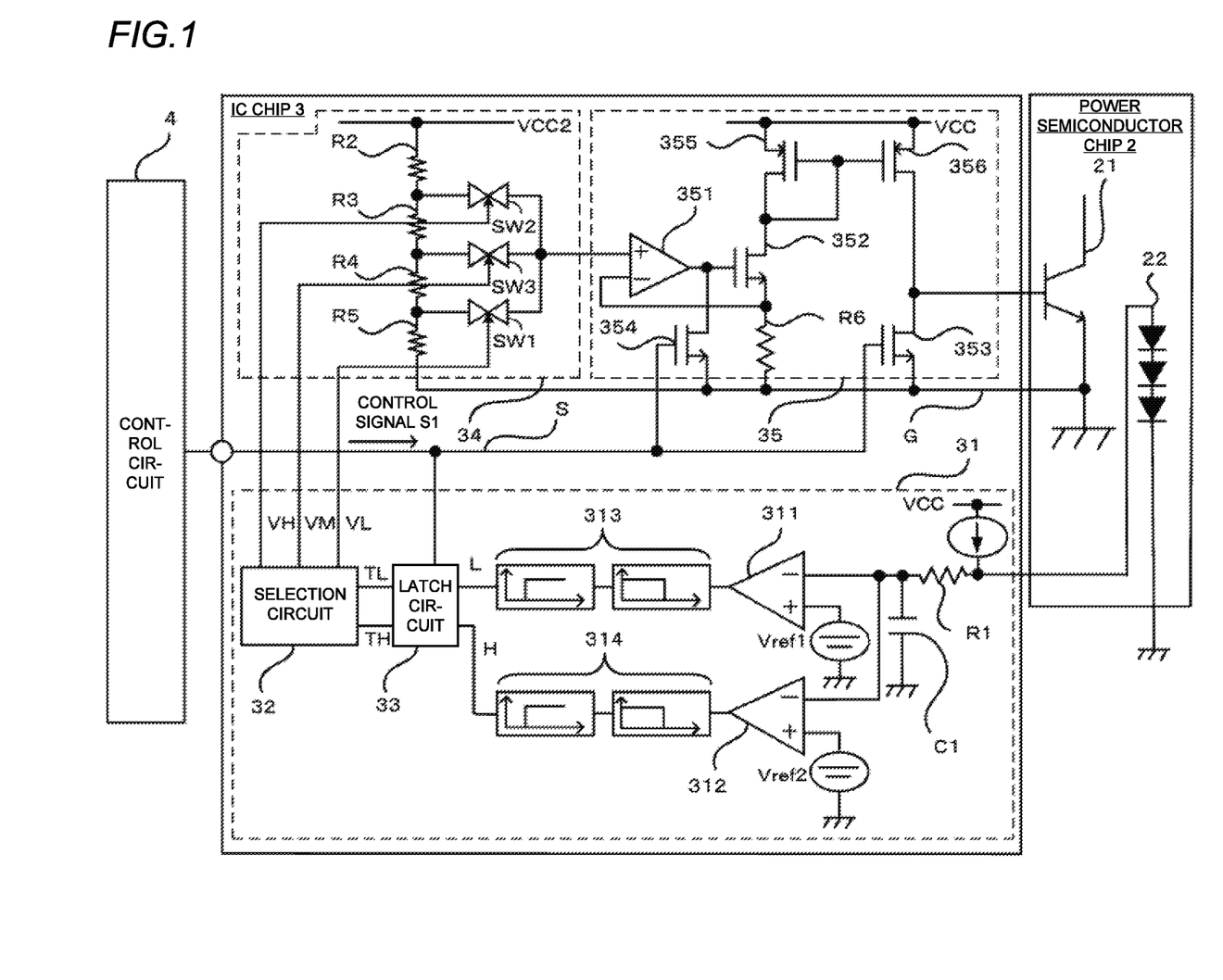
FIG. 1 is a circuit diagram illustrating the overall configuration of a power conversion device according to a first embodiment of the present invention.

An IPM (Intelligent Power Module) 1 according to the present embodiment is a power conversion device applicable to, for example, joints of industrial robots, elevators, and air conditioners for business purposes, and is configured to include a power semiconductor chip 2 and an IC chip 3 as shown in FIG. 1.

The power semiconductor chip 2 is configured, for example, by forming an IGBT 21 and a plurality of diodes 22 in the same chip. The IGBT 21 is turned on according to a drive signal which is applied from the IC chip 3 to the gate, and supplies constant power to a load (not shown in the drawings) from the collector via the emitter. Also, the emitter of the IGBT 21 is connected to a ground line G of the IC chip 3 to be described below. The plurality of diodes 22 is formed in an area inside the power semiconductor chip 2 which is an area different from an area where the IGBT 21 is formed and is an appropriate area for detecting the temperature of the IGBT 21. The plurality of diodes 22 is connected in series, and the anode of one diode 22 is connected to a power supply VCC and is connected to the IC chip 3 to be described below, and the cathode of another diode 22 is grounded. Voltage drop in the plurality of diodes 22 which is caused by switching operations of the IGBT 21 is monitored by the IC chip 3, whereby the operating temperature of the IGBT 21 formed in the same chip is detected.

The IC chip 3 is a drive circuit for changing the amount of current to drive the IGBT 21, according to the operating temperature of the IGBT 21, and mainly includes a temperature detecting unit 31, a switch unit 34, and a drive unit 35.

The temperature detecting unit 31 detects the operating temperature of the IGBT 21 by detecting the voltage between both ends of the plurality of diodes 22 and monitoring the voltage between both ends of the diodes. The temperature detecting unit 31 includes a first comparator 311, a second comparator 312, first and second filter circuits 313 and 314 which are connected to the output terminals of the first and second comparators 311 and 312, respectively, the selection circuit 32, and the latch circuit 33.

The first comparator 311 has a non-inverting input terminal which is connected to an anode of the plurality of diodes 22 via a resistor R1 for element protection, and an inverting input terminal which is connected to the plus terminal of a reference voltage source Vref1 having a voltage value corresponding to a predetermined temperature. The minus terminal of the reference voltage source Vref1 is grounded.

The second comparator 312 has a non-inverting input terminal which is connected to the anode of the plurality of diodes 22 via the resistor R1, and an inverting input terminal which is connected to the plus terminal of a reference voltage source Vref2 having a voltage value corresponding to a predetermined temperature different from the predetermined temperature for the first comparator 311. The minus terminal of the reference voltage source Vref2 is grounded.

Between the non-inverting input terminals of the first and second comparators 311 and 312 and the resistor R1, one end of a capacitor C1 for stabilizing the detected voltage (the voltage between both ends of the plurality of diodes 22) is connected. The other end of the capacitor C1 is grounded.

If the value of the voltage between both ends of the plurality of diodes 22 is input, the first and second comparators 311 and 312 compare the input value with the voltage values of the reference voltage sources Vref1 and Vref2, respectively. If the voltage value of the reference voltage source Vref1 or Vref2 is larger, a corresponding comparator outputs a high-level output signal at a high level; whereas if the value of the voltage between both ends of the plurality of diodes 22 is larger, each comparator outputs a low-level output signal.

In the present embodiment, the voltage values of the reference voltage source Vref1 and the reference voltage source Vref2 are appropriately set such that the output signals of the first comparator 311 and the second comparator 312 correspond to different ranges in the operating temperature range of the IGBT 21 to be detected, respectively. For example, the reference voltage sources Vref1 and Vref2 are set such that Vref1 is larger than Vref2. According to this configuration, the first comparator 311 covers a lower temperature range and the second comparator 312 covers a higher temperature range.

Specifically, in the case where the operating temperature of the IGBT 21 is low, voltage drop in the plurality of diodes 22 which occurs when a constant current flows is small. Therefore, the voltage value which is input to the inverting input terminals of the first and second comparators 311 and 312 is larger than the voltage values of the reference voltage sources Vref1 and Vref2. Therefore, both of the output signals of the first and second comparators 311 and 312 become the low level. Meanwhile, in the case where the operating temperature of the IGBT 21 is high, voltage drop in the plurality of diodes 22 which occurs when a constant current flows is large. Therefore, the voltage value which is input to the inverting input terminals of the first and second comparators 311 and 312 is smaller than the voltage values of the reference voltage sources Vref1 and Vref2. Therefore, both of the output signals of the first and second comparators 311 and 312 become the high level.

The first and second filter circuits 313 and 314 are, for example, digital filters, and remove predetermined noise components from the output signals of the first and second comparators 311 and 312 by causing predetermined delays, respectively. The first filter circuit 313 has an input terminal which is connected to the output terminal of the first comparator 311, and an output terminal which is connected to a low temperature side input terminal L of the latch circuit 33.

Similarly, the second filter circuit 314 has an input terminal which is connected to the output terminal of the second comparator 312, and an output terminal which is connected to a high temperature side input terminal H of the latch circuit 33.

Although FIG. 1 shows the example in which each of the first and second filter circuits 313 and 314 is composed of a plurality of stages, the number of filter stages is arbitrary, and can be set to an appropriate number for obtaining desired effects.

Figure 2:
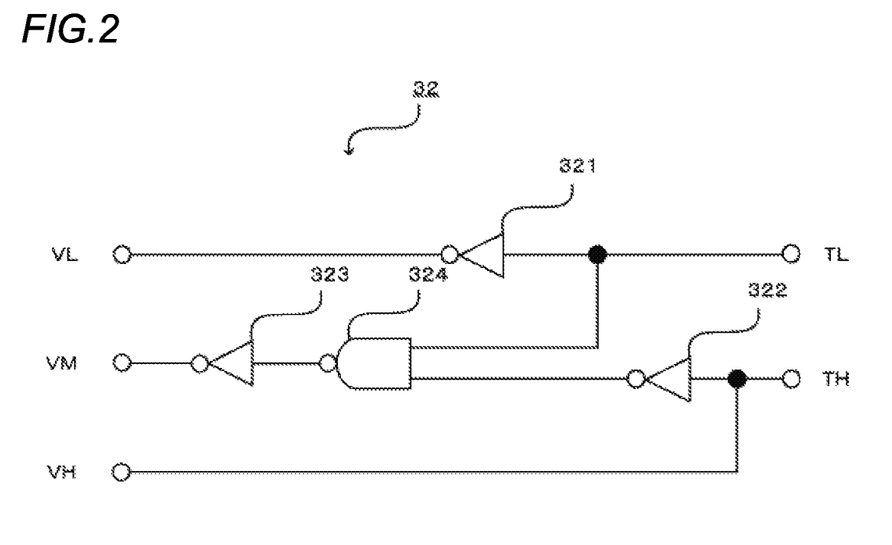
FIG. 2 is a circuit diagram illustrating a specific example of the configuration of a selection circuit 32 shown in FIG. 1.

The selection circuit 32 selectively supplies output signals from the latch circuit 33 to the switch unit 34. An example of the configuration of the selection circuit 32 is shown in FIG. 2. As shown in FIG. 2, the selection circuit 32 is configured to include a logic IC, and includes first to third inverters (NOT gates) 321 and 323, and a NAND gate 324.

The first inverter 321 has an input terminal which is connected to a low temperature side output terminal TL of the latch circuit 33, and an output terminal which is connected to a first output terminal VL of the selection circuit 32.

The second inverter 322 has an input terminal which is connected to a high temperature side output terminal TH of the latch circuit 33, and an output terminal which is connected to one of input terminals of the NAND gate 324. Also, the high temperature side output terminal TH of the latch circuit 33 is connected to a second output terminal VH of the selection circuit 32.

The third inverter 323 has an input terminal which is connected to the output terminal of the NAND gate 324, and an output terminal which is connected to a third output terminal VM of the selection circuit 32.

The other input terminal of the NAND gate 324 is connected to the low temperature side output terminal TL of the latch circuit 33.

In the case where the operating temperature of the IGBT 21 is low, as described above, the signal which is input from the low temperature side output terminal TL of the latch circuit 33, i.e. the output signal of the first comparator 311 has the low level, and the signal which is input from the high temperature side output terminal TH of the latch circuit 33, i.e. the output signal of the second comparator 312 has the low level. In this case, according to the circuit configuration shown in FIG. 2, only from the first output terminal VL, a high-level signal is output, and from the second and third output terminals VH and VM, low-level signals are output.

Meanwhile, in the case where the operating temperature of the IGBT 21 is high, as described above, the signal which is input from the low temperature side output terminal TL of the latch circuit 33 has the high level, and the signal which is input from the high temperature side output terminal TH of the latch circuit 33 has a high level. In this case, according to the circuit configuration shown in FIG. 2, only from the second output terminal VH, a high-level signal is output, and from the first and third output terminals VL and VM, low-level signals are output.

In the other case, for example, in the case where the signal which is input from the low temperature side output terminal TL of the latch circuit 33 has the high level, and the signal which is input from the high temperature side output terminal of the latch circuit 33 has the low level, according to the circuit configuration shown in FIG. 2, only from the third output terminal VM, a high-level signal is output, and from the first and second output terminals VL and VH, low-level signals are output. This case corresponds to the case where the operating temperature of the IGBT 21 is a medium temperature in a temperature range which is defined by a low temperature and a high temperature.

Figure 3:
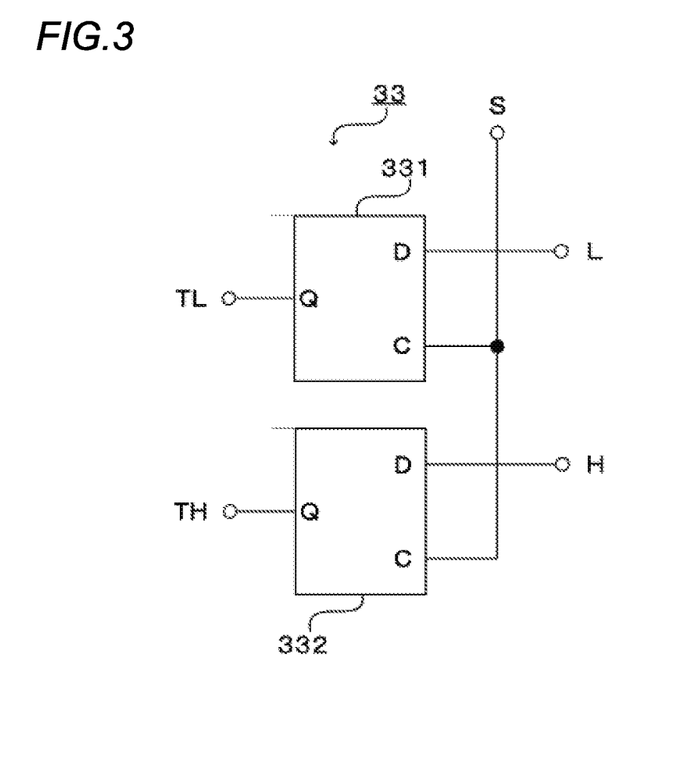
FIG. 3 is a circuit diagram illustrating a specific example of the configuration of a latch circuit 33 shown in FIG. 1.

Referring to FIG. 1 again, the latch circuit 33 detects a control signal S1 which is input from an external control circuit 4 (as will be described below, a signal to turn off the IGBT 21), and latches the operating temperature of the IGBT 21 detected, at the timing to turn off the IGBT 21. An example of the configuration of the latch circuit 33 is shown in FIG. 3. As shown in FIG. 3, the latch circuit 33 is configured to include a logic IC, and includes a first D latch circuit 331 and a second D latch circuit 332.

The first D latch circuit 331 has a D (data) input terminal which is connected to the output terminal of the first filter circuit 313, and a C (clock) input terminal which is connected to a signal line S. The above-mentioned control signal S1 from the external control circuit 4 is supplied to the C input terminal via the signal line S. Also, the first D latch circuit 331 terminal has a Q output terminal, which is the low temperature side output terminal TL of the latch circuit 33 and is connected to the input terminal of the first inverter 321 described above.

Similarly, the second D latch circuit 332 has a D input terminal which is connected to the output terminal of the second filter circuit 314, and a C input terminal which is connected to the signal line S, and the above-mentioned control signal S1 is supplied to the C input terminal via the signal line S. Also, the second D latch circuit 332 has a Q output terminal, which is the high temperature side output terminal TH of the latch circuit 33 and is connected to the input terminal of the second inverter 322 and the second output terminal VH of the selection circuit 32.

The latch circuit 33 using the above-described configuration holds the states of the output signals from the first and second comparators 311 and 312 at the timing when a high-level control signal S1 (a signal to turn off the IGBT 21) is supplied from the external control circuit 4 to the C input terminals via the signal line S, and holds the states until the next high-level control signal S1 is supplied. In other words, the output of the latch circuit 33 is fixed after the IGBT 21 is turned off once until the next time the IGBT is turned off. The details of the operation of the latch circuit 33 will be described below.

Referring to FIG. 1 again, the switch unit 34 includes first to third switches SW1 to SW3, resistors R2 to R4 which are connected in series so as to form a resistance voltage divider circuit, and a voltage source VCC2, and each of the switches SW1 to SW3 is turned on according to the output from the selection circuit 32. One end of the resistance voltage divider circuit formed by the resistors R2 to R4 is connected to the voltage source VCC2, and the other end is connected to the ground line G via a resistor R5, thereby being grounded. Each of the first to third switches SW1 to SW3 includes, for example, a CMOS switch configured by connecting an n-channel MOSFET and a p-channel MOSFET in parallel.

The input side of the first switch SW1 is connected to the voltage source VCC2 via the resistors R2 to R4, and the output side thereof is connected to a non-inverting input terminal of a differential amplifier 351 to be described below. Also, the gate of one MOSFET of the first switch SW1 is connected to the first output terminal VL of the selection circuit 32 such that the first switch is turned on in the case where both of the output signals of the first and second comparators 311 and 312 have the low levels.

The input side of the second switch SW2 is connected to the voltage source VCC2 via the resistor R2 for voltage drop, and the output side thereof is connected to the non-inverting input terminal of the differential amplifier 351. Also, the gate of one MOSFET of the second switch SW2 is connected to the second output terminal VH of the selection circuit 32 such that the second switch is turned on in the case where both of the output signals of the first and second comparators 311 and 312 have the high levels.

The input side of the third switch SW3 is connected to the voltage source VCC2 via the resistors R2 and R3 for voltage drop, and the output side thereof is connected to the non-inverting input terminal of the differential amplifier 351. Also, the gate of one MOSFET of the third switch SW3 is connected to the third output terminal VM of the selection circuit 32 such that the third switch is turned on in the case where the output signal of the first comparator 311 has the high level and the output signal of the second comparator 312 has the low level.

By the resistance voltage divider circuit configured with the resistors R2 to R4, in the case where the first switch SW1 is turned on, the lowest voltage is applied to the non-inverting input terminal of the differential amplifier 351, and in the case where the second switch SW2 is turned on, the highest voltage is applied to the non-inverting input terminal of the differential amplifier 351, and in the case where the third switch SW3 is turned on, a medium voltage between the lowest voltage and the highest voltage is applied to the non-inverting input terminal of the differential amplifier 351. These correspond to the case where the operating temperature of the IGBT 21 is low in the predetermined operating temperature range, the case where the operating temperature is high, and the case where the operating temperature is a medium temperature between the low temperature and the high temperature, respectively. Also, the resistance values of the resistors R2 to R4 can be appropriately set such that a desired resistance voltage division effect is obtained.

The case where the lowest voltage is applied to the non-inverting input terminal of the differential amplifier 351 is the case where the first switch SW1 is on, and as described with reference to FIG. 2, this is the case where only from the first output terminal VL of the selection circuit 32, a high-level signal has been output. In other words, this case is the case where both of the output signals of the first and second comparators 311 and 312 have had the low levels, i.e. the case where the operating temperature of the IGBT 21 has been low.

Also, the case where the highest voltage is applied to the non-inverting input terminal of the differential amplifier 351 is the case where the second switch SW2 is on, and as described with reference to FIG. 2, this is the case where only from the second output terminal VH of the selection circuit 32, a high-level signal has been output. In other words, this case is the case where both of the output signals of the first and second comparators 311 and 312 have had the high levels, i.e. the case where the operating temperature of the IGBT 21 has been high.

Similarly, the case where the medium voltage is applied is the case where only from the third output terminal VM of the selection circuit 32, a high-level signal has been output, and this case is the case where the operating temperature of the IGBT 21 has been a medium temperature in the temperature range defined by the low temperature and the high temperature.

The drive unit 35 changes the amount of current to drive the IGBT 21, according to the operating temperature of the IGBT 21, thereby adjusting the drive capability of the IGBT 21. The drive unit 35 includes the differential amplifier 351, an N-type MOSFET 352, turn-off MOSFETs 353 and 354, the power supply VCC, P-type MOSFETs 355 and 356 forming a current mirror circuit which is connected to the power supply VCC, and a resistor R6. The details of the drive unit 35 have been described, for example, in JP-A-2013-219633. Therefore, here, a detailed description of the entire drive unit will not be made, and points related to the present embodiment will be described below.

As a point related to the present embodiment, the turn-off MOSFET 353 will be described. The turn-off MOSFET 353 is composed of, for example, an N-type MOSFET, and the drain thereof is connected to the power supply VCC via the current mirror circuit formed by the P-type MOSFETs 355 and 356 and is connected to the gate of the IGBT 21. The source of the turn-off MOSFET 353 is grounded via the ground line G. Also, the gate of the turn-off MOSFET 353 is connected to the signal line S. If a high-level control signal S1 is supplied to the gate via the signal line S, the turn-off MOSFET 353 is turned on, thereby electrically connecting the gate of the IGBT 21 and the ground. As a result, electric charge stored in the IGBT 21 is drawn out, whereby the IGBT 21 is turned off. Meanwhile, in the case where a low-level control signal S1 is applied to the gate via the signal line S, the turn-off MOSFET 353 is turned off, thereby electrically disconnecting the gate of the IGBT 21 from the ground.

The control signal S1 which is supplied to the gate of the turn-off MOSFET 353 and the control signal S1 which is supplied to the C input terminals of the latch circuit 33 described above are the same. Therefore, the timing when the IGBT 21 is turned off and the timing when the latch circuit 33 latches the signal representing the operating temperature of the IGBT 21 detected are almost the same.

(Operation)

Now, the operation of the IPM 1 using the above-described configuration will be described. The following description will be made particularly with a focus on the operations of the selection circuit 32 and the latch circuit 33.

In the temperature detecting unit 31, to the inverting input terminals of the first and second comparators 311 and 312, the voltage between both ends of the plurality of diodes 22 is applied. For example, in the case where the operating temperature of the IGBT 21 is a low temperature, both of the output signals of the first and second comparators 311 and 312 have the low levels. The low-level output signals are input to the low temperature side input terminal L and high temperature side input terminal H of the latch circuit 33 shown in FIG. 3, via the first and second filter circuits 313 and 314.

The low-level output signal of the first comparator 311 is input to the D input terminal of the first D latch circuit 331, and the low-level output signal of the second comparator 312 is input to the D input terminal of the second D latch circuit 332. Now, the case where the control signal S1 to turn off the IGBT 21 is input from the external control circuit 4 shown in FIG. 1 will be described. If the control signal S1 is applied to the gate of the turn-off MOSFET 353, the turn-off MOSFET 353 is turned on, electric charge stored in the gate of the IGBT 21 is drawn out via the turn-off MOSFET 353, whereby the IGBT 21 is turned off.

The control signal S1 is also supplied to the C input terminals of the first and second D latch circuits 331 and 332 of the latch circuit 33 shown in FIG. 3, via the signal line S. The control signal S1 which turns on the normally-off type turn-off MOSFET 353 has the high level. In other words, at the timing to turn off the IGBT 21, the high-level control signal S1 is supplied even to the latch circuit 33.

In the case where the control signal S1 has the high level, in the first and second D latch circuits 331 and 332 of the latch circuit 33, since the values of their D inputs become their Q outputs, from the low temperature side output terminal TL and the high temperature side output terminal TH, the above-mentioned low-level signals are output.

Subsequently, in the case of turning on the IGBT 21, since it is required to turn off the turn-off MOSFET 353, from the external control circuit 4, the low-level control signal S1 is supplied to the C input terminals of the first and second D latch circuits 331 and 332. In this case, in each of the first and second D latch circuits 331 and 332, when the C input has the low level, the last state of the D input when the C input was at the high level is held. In other words, the output signals at the previous timing when the IGBT 21 was turned off are outputs as the output signals from the low temperature side output terminal TL and high temperature side output terminal TH of the latch circuit 33, until the next time a high-level control signal S1 is supplied from the external control circuit 4 in order to turn off the IGBT 21. As described above, based on the output signals held by the latch circuit 33, the drive capability of the IGBT 21 is adjusted by the selection circuit 32, the switch unit 34, and the drive unit 35. In other words, the drive capability of the IGBT 21 is fixed until the next time a high-level control signal S1 is input.

As described above, according to the present embodiment, in adjusting the drive capability of the IGBT 21 according to the operating temperature of the IGBT 21 (changing the amount of current to drive the IGBT 21), it becomes possible to reduce the influence of switching of the IGBT 21. Specifically, the latch circuit 33 latches the output signals of the first and second comparators 311 and 312 which are signals representing the operating temperature of the IGBT 21 when the control signal S1 has the high level. In the case where the control signal S1 has the high level, the turn-off MOSFET 353 draws out electric charge stored in the gate of the IGBT 21, thereby turning off the IGBT. Therefore, the latch circuit 33 keeps outputting the output signals of the first and second comparators 311 and 312 latched, until the next time a high-level control signal S1 is input. Then, if the amount of current to drive the IGBT 21 is changed according to the operating temperature of the IGBT 21, the operating temperature which is detected when the IGBT 21 is turned off next time is reflected. Based on that detection result, the amount of current to drive the IGBT 21 is changed, it is unlikely to be influenced by switching noise of the IGBT 21, for example, noise which is generated when the IGBT is turned on.

Second Embodiment

Now, a second embodiment will be described. In the first embodiment, the signal representing the operating temperature of the IGBT 21 is processed as a digital signal, for example, in the selection circuit 32 and the latch circuit 33. However, the present invention is not limited to this configuration, and it is also possible to use a circuit configuration for processing an analog signal representing the operating temperature of the IGBT 21. Hereinafter, the second embodiment using such a circuit configuration will be described. Components identical or similar to those of the first embodiment are denoted by the same reference symbols, and a detailed description thereof will not be made.

(Configuration)

Figure 4:
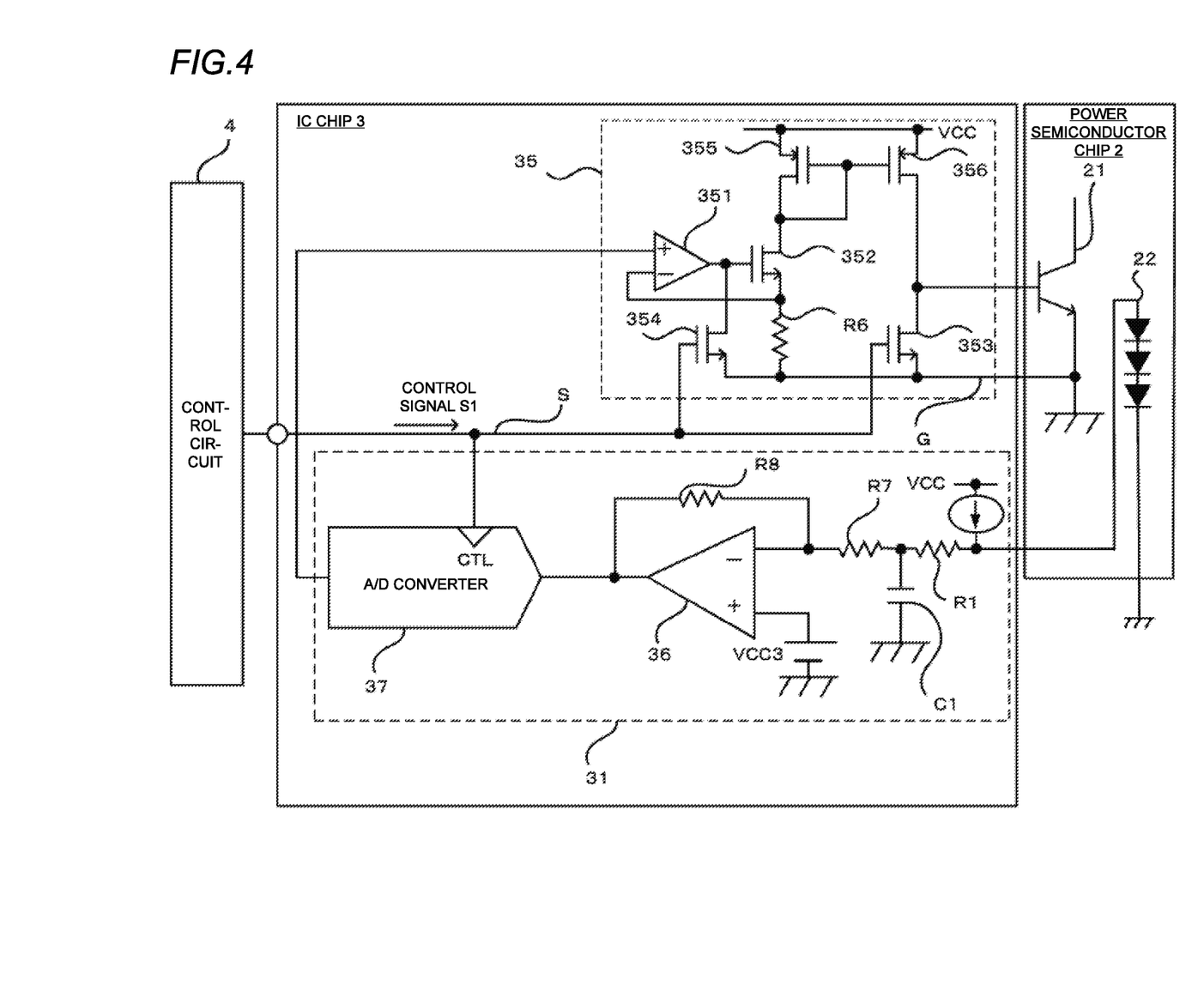
FIG. 4 is a circuit diagram illustrating the overall configuration of a power conversion device according to a second embodiment of the present invention.

As shown in FIG. 4, a difference from the first embodiment is that the temperature detecting unit 31 of the IPM 1 includes an inverting amplifier 36 and an A/D converter 37 in place of the first and second comparators 311 and 312, the first and second filter circuits 313 and 314, the latch circuit 33, and the selection circuit 32. In this configuration, it is possible to omit the switch unit 34.

The inverting amplifier 36 detects and acquires the operating temperature of the IGBT 21 as an analog signal. The inverting amplifier 36 has a non-inverting input terminal which is connected to the plus terminal of a voltage source VCC3. The minus terminal of the voltage source VCC3 is grounded. Also, the inverting input terminal of the inverting amplifier 36 is connected to the resistor R1 via a resistor R7. This inverting input terminal also forms a feedback loop via a resistor R8 which is a feedback resistor. The resistance values of the resistors R7 and R8 are appropriately set such that a desired amplification factor appropriate for detecting the operating temperature of the IGBT 21 is obtained.

The A/D converter 37 converts the analog signal which is output from the inverting amplifier 36, into digital signals, and supplies the digital signals obtained by conversion to the differential amplifier 351 of the drive unit 35. The A/D converter 37 has an input terminal which is connected to the output terminal of the inverting amplifier 36, and an output terminal which is connected to the inverting input terminal of the differential amplifier 351. Also, a control terminal CTL of the A/D converter 37 is connected to the signal line S, and the same control signal S1 as that of the first embodiment is input from the external control circuit 4 to the control terminal CTL of the A/D converter 37 via the signal line S.

The A/D converter 37 performs sampling and holding at timings when the input control signal S1 has the high level. More specifically, the A/D converter 37 is configured such that if a high-level control signal S1 is input to the control terminal CTL when the A/D converter is performing an A/D conversion process, the A/D converter 37 finishes that process, and then continues to output the last A/D conversion result (a digital signal), without performing the subsequent A/D conversion, until the next high-level control signal S1 is input.

Timings when the control signal S1 has the high level are timings to draw out electric charge stored in the gate of the IGBT 21, thereby turning off the IGBT. In other words, timings for the A/D converter 37 to perform sampling and holding are timings to turn off the IGBT 21.

As described above, according to the present embodiment, the A/D converter 37 samples and holds an A/D conversion result obtained at a timing to turn off the IGBT 21, and keep outputting the A/D conversion result sampled and held, to the drive unit 35, until the next timing to turn off the IGBT 21. Therefore, similarly to the first embodiment, the operating temperature of the IGBT 21 which is detected is the temperature which is obtained at a timing to turn off the IGBT 21, and a signal according to the detection result continues to be supplied to the drive unit 35 until the next timing to turn off the IGBT 21. Therefore, the drive capability which the drive unit 35 has adjusted according to the operating temperature of the IGBT 21 detected is fixed until the next time the IGBT 21 is turned off and a new detection result is reflected. Therefore, it is possible to obtain the same effects and advantages as those of the first embodiment.

Also, since it is possible to simplify the circuit configuration of the entire IC chip 3 as compared to the first embodiment, benefits such as the benefit of being able to simplify the manufacturing process of the IC chip 3 are also obtained.

Other Embodiments

Although the embodiments of the present invention have been described above, the present invention is not limited to the above-described embodiments, and various modifications and variations are possible without departing from the technical scope of the present invention.

(1) For example, in the second embodiment, the case where the control signal S1 is input from the external control circuit 4 to the control terminal CTL of the A/D converter 37 via the signal line S identical to that of the first embodiment has been described. However, the present invention is not limited to this case. For example, it can be considered the case where because of limitations of the chip layout of the IC chip 3, if the same control signal S1 is input from the same signal line S to both of the A/D converter 37 and the turn-off MOSFET 353 for turning off the IGBT 21, timings for the A/D converter 37 to perform sampling and holding may be influenced by noise of other elements in the same chip. In order to comply with a request for putting emphasis on the accuracy of timings for the A/D converter 37 to perform sampling and holding, a configuration as shown in FIG. 5 may be used.

Figure 5:
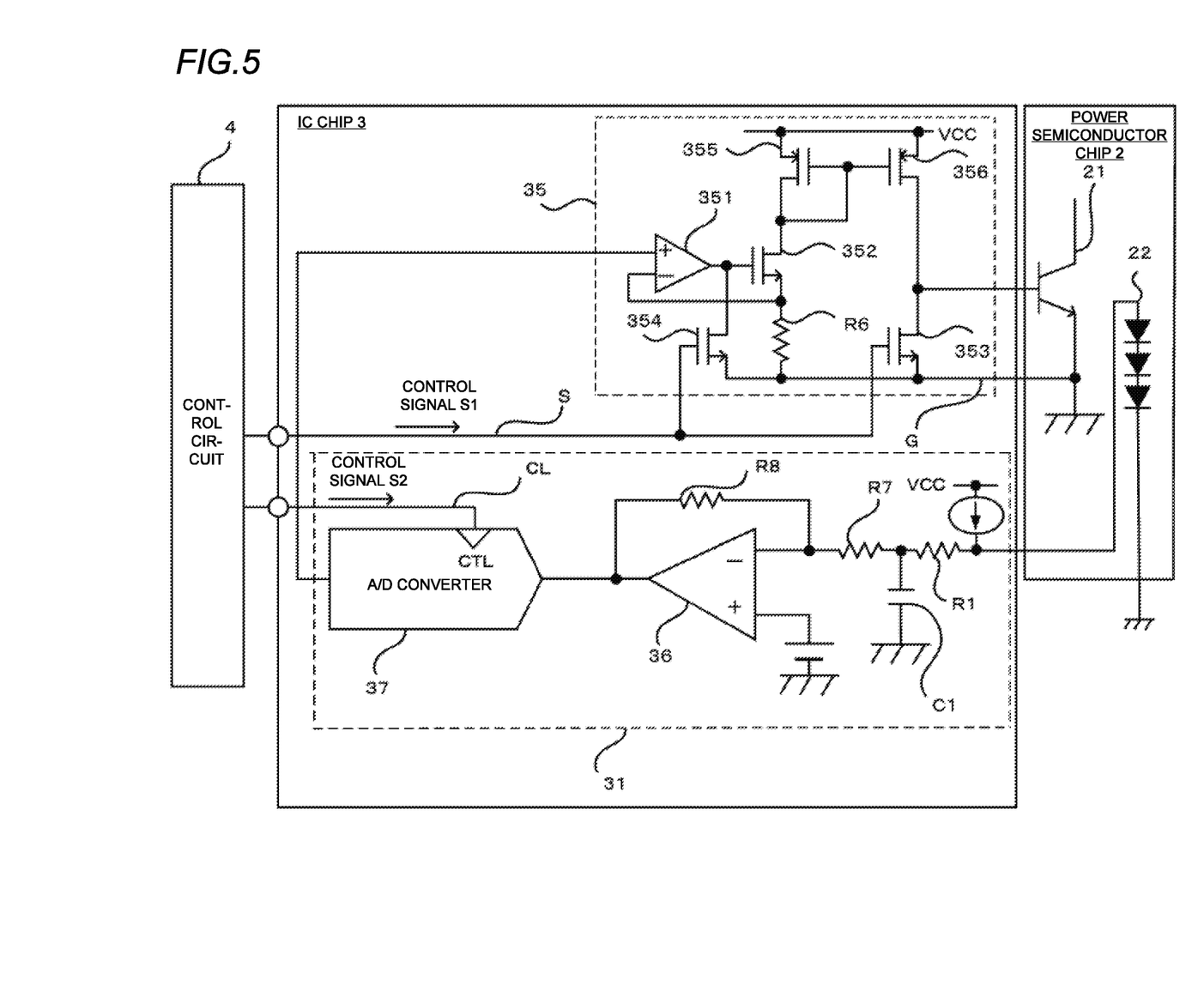
FIG. 5 is a circuit diagram illustrating the overall configuration of a power conversion device according to another embodiment of the present invention.

As shown in FIG. 5, in the IPM 1, separately from the signal line S, a second signal line CL for inputting a control signal S2 to the control terminal CTL of the A/D converter 37 may be provided. The control signal S2 to determine timings for the A/D converter 37 to perform sampling and holding is a signal which is generated based on the control signal S1, and is a signal synchronized with the control signal S1, and is sampled and held by the A/D converter 37 at timings to turn off the IGBT 21, similarly to the above-described embodiments.

Figure 6:
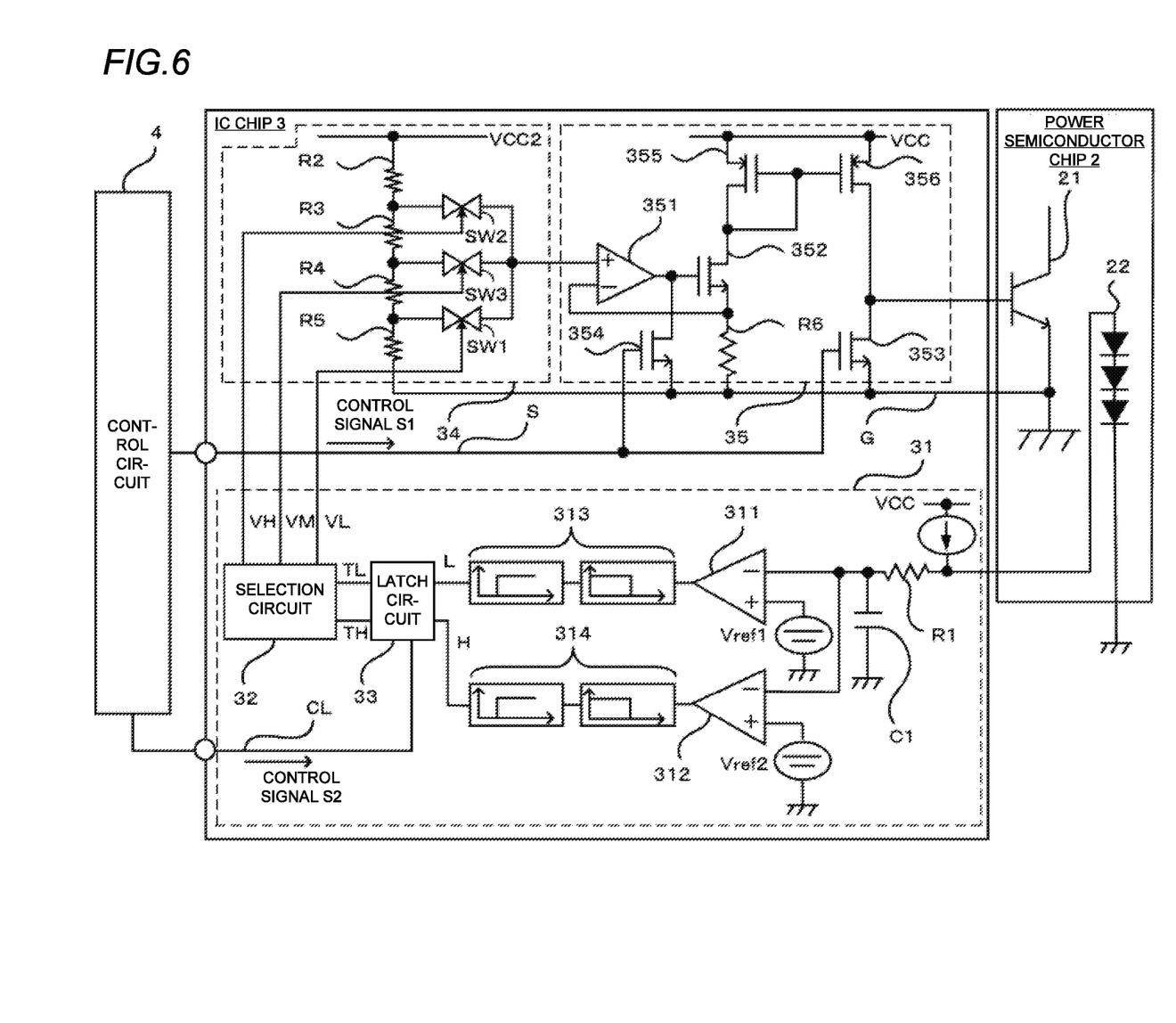
FIG. 6 is a circuit diagram illustrating the overall configuration of a power conversion device according to a further embodiment of the present invention.

(2) Similarly, as shown in FIG. 6, even in the configuration of the first embodiment, separately from the signal line S for supplying the control signal S1 for turning off the IGBT 21, a second signal line CL may be provided such that via the second signal line CL, a control signal is supplied to the C input terminals of the latch circuit 33.

(3) Also, in the first embodiment, the case where the latch circuit 33 includes the first and second D latch circuits 331 and 332 has been described. However, the present invention is not limited to this case. For example, in place of the first and second D latch circuits 331 and 332, first and second D flip-flops may be used. In this case, unlike the first embodiment, it is desirable to use D flip-flops for storing D inputs at timings when the signal level of the control signal S1 rises, i.e. timings when the control signal S1 transitions from the high level to the low level. Since timings when the control signal S1 transitions from the high level to the low level are timings when the IGBT 21 needs to transition from the ON state to the OFF state, if the above-mentioned type of D flip-flops are used, it is possible to store a signal representing a temperature detected when the IGBT 21 was in the OFF state, and change the amount of current to drive the IGBT 21 based on the stored signal, until the next time the signal level of the control signal S1 falls from the high level. Therefore, it is possible to obtain the same effects and advantages as those of the first embodiment.

(4) Also, in the above-mentioned embodiments, the IGBT 21 has been described as an example of a power semiconductor switching device. However, the present invention is not limited to this case. For example, a device having power capacity smaller than that of the IGBT 21 may be used, and for an application requiring switching faster than that of the IGBT 21, in place of the IGBT 21, a power MOSFET may be used.

The invention claimed is:

1. A power conversion device comprising:
a power semiconductor switching device configured to supply constant power to a load by switching and to be turned on and off by a control signal from an external control circuit; and
a drive circuit configured to detect an operating temperature of the power semiconductor switching device and drive the power semiconductor switching device according to a result of the detection, the drive circuit including a temperature detecting unit configured to receive the control signal from the external control circuit, to detect the operating temperature of the power semiconductor switching device based on the control signal turning the power semiconductor switching device on and off, such that when the temperature detecting unit receives a control signal in a first state from the external control circuit to turn off the power semiconductor switching device, the detected operating temperature of the power semiconductor switching device at a time the temperature detecting unit received the control signal in the first state is fixed until a next control signal in the first state is received by the temperature detecting unit from the external control circuit.

2. The power conversion device according to claim 1, wherein the temperature detecting unit includes:
a comparator configured to compare an output voltage that is based on the operating temperature and output from a temperature detector configured to detect the operating temperature of the power semiconductor switching device, with a reference voltage corresponding to a predetermined temperature; and
a latch circuit configured to latch a result of the comparison by the comparator, based on the control signal.

3. The power conversion device according to claim 2, wherein
the temperature detecting unit includes a plurality of comparators each configured to compare the output voltage with a different one of respective reference voltages,
the latch circuit is configured to latch results of the comparisons by the plurality of comparators, and
the temperature detecting unit further includes a selection circuit configured to selectively output the plurality of comparison results latched by the latch circuit.

4. A power conversion device comprising:
a power semiconductor switching device configured to supply constant power to a load by switching and to be turned on and off by a control signal from an external control circuit; and
a drive circuit configured to detect an operating temperature of the power semiconductor switching device and drive the power semiconductor switching device according to a result of the detection, the drive circuit including a temperature detecting unit configured to receive the control signal from the external control circuit and detect the operating temperature of the power semiconductor switching device at timings according to the control signal, the temperature detecting unit including:
an inverting amplifier configured to invert and amplify a voltage that is based on a temperature of the power semiconductor switching device and output from a temperature detector configured to detect the temperature of the power semiconductor switching device, and
an A/D converter configured to perform A/D conversion on a result of inverting and amplifying by the inverting amplifier, and sample and hold a result of the A/D conversion, based on the control signal.

5. A power conversion device comprising:
a power semiconductor switching device configured to supply constant power to a load by switching and to be turned on and off by a first control signal from an external control circuit; and
a drive circuit configured to detect an operating temperature of the power semiconductor switching device and drive the power semiconductor switching device according to a result of the detection, the drive circuit including a temperature detecting unit configured to receive a second control signal generated based on the first control signal output from the external control circuit and different from the first control signal, and detect the operating temperature of the power semiconductor switching device at timings according to the second control signal.

6. The power conversion device according to claim 5, wherein the temperature detecting unit includes:
a comparator configured to compare an output voltage that is based on the operating temperature and output from a temperature detector configured to detect the operating temperature of the power semiconductor switching device, with a reference voltage corresponding to a predetermined temperature; and
a latch circuit configured to latch a result of the comparison by the comparator, based on the second control signal.

7. The power conversion device according to claim 6, wherein
the temperature detecting unit includes a plurality of comparators each configured to compare the output voltage with a different respective reference voltage,
the latch circuit is configured to latch results of the comparisons by the plurality of comparators, and
the temperature detecting unit further includes a selection circuit configured to selectively output the plurality of comparison results latched by the latch circuit.

8. The power conversion device according to claim 5, wherein the temperature detecting unit includes:
an inverting amplifier configured to invert and amplify a voltage that is based on a temperature of the power semiconductor switching device and output from a temperature detector configured to detect the temperature of the power semiconductor switching device; and
an A/D converter configured to perform A/D conversion on a result of inverting and amplifying by the inverting amplifier, and sample and hold a result of the A/D conversion result, based on the second control signal.

* * * * *